(12) United States Patent
Takiar et al.

(10) Patent No.: US 8,129,272 B2
(45) Date of Patent: Mar. 6, 2012

(54) HIDDEN PLATING TRACES

(75) Inventors: Hem Takiar, Fremont, CA (US);
Cheeman Yu, Madison, WI (US); Ken Jian Ming Wang, San Francisco, CA (US); Chin-Tien Chiu, Taichung (TW);
Han-Shiao Chen, Taichung County (TW); Chih-Chin Liao, Changhua (TW)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 12/493,582

(22) Filed: Jun. 29, 2009

(65) Prior Publication Data

US 2009/0263969 A1    Oct. 22, 2009

Related U.S. Application Data

(62) Division of application No. 11/321,929, filed on Dec. 29, 2005, now Pat. No. 7,592,699.

(51) Int. Cl.
*H01L 21/44* (2006.01)

(52) U.S. Cl. ........ 438/666; 438/111; 438/123; 438/618; 257/640; 257/643; 257/676; 257/773; 257/E23.031

(58) Field of Classification Search .................. 257/670, 257/673, 676, 773; 438/111, 123, 618, 666
See application file for complete search history.

(56) References Cited

U.S. PATENT DOCUMENTS

| | | | |
|---|---|---|---|
| 3,984,166 A | 10/1976 | Hutchison | |
| 5,216,278 A * | 6/1993 | Lin et al. ........................ | 257/688 |
| 6,319,065 B1 | 11/2001 | Farnworth et al. | |
| 6,424,030 B2 | 7/2002 | Masayuki et al. | |
| 6,461,892 B2 | 10/2002 | Beroz | |
| 6,828,174 B2 | 12/2004 | Katagiri et al. | |
| 6,888,362 B2 | 5/2005 | Eldridge et al. | |
| 6,896,182 B2 | 5/2005 | Sakaguchi | |
| 7,042,073 B2 | 5/2006 | Kado et al. | |
| 2005/0020134 A1 * | 1/2005 | Winings et al. ............... | 439/608 |
| 2007/0132066 A1 | 6/2007 | Takiar et al. | |
| 2007/0145543 A1 * | 6/2007 | Zeng et al. .................... | 257/664 |
| 2007/0152319 A1 | 7/2007 | Takiar et al. | |
| 2007/0155247 A1 | 7/2007 | Takiar et al. | |

OTHER PUBLICATIONS

Notice of Allowance dated Jun. 1, 2010 in U.S. Appl. No. 11/321,931.
Office Action dated Sep. 16, 2009 in U.S. Appl. No. 11/321,931.

* cited by examiner

*Primary Examiner* — Wai Sing Louie

(74) *Attorney, Agent, or Firm* — Vierra Magen Marcus & DeNiro LLP (57) ABSTRACT

A strengthened semiconductor die substrate and package are disclosed. The substrate may include contact fingers formed with nonlinear edges. Providing a nonlinear contour to the contact finger edges reduces the mechanical stress exerted on the semiconductor die which would otherwise occur with straight edges to the contact fingers. The substrate may additionally or alternatively include plating traces extending at an angle from the contact fingers. Extending at an angle, at least the ends of the plating traces at the edge of the substrate are covered beneath a lid in which the semiconductor package is encased. Thus, when in use with a host device, contact between the ends of the plating traces beneath the lid and contact pins of the host device is avoided.

16 Claims, 13 Drawing Sheets

HIDDEN PLATING TRACES

PRIORITY DATA

This application is a divisional of U.S. patent application Ser. No. 11/321,929, entitled "Hidden Plating Traces," filed on Dec. 29, 2005, now pending.

BACKGROUND OF THE INVENTION

1. Field of the Invention

Embodiments of the present invention relate to a method of forming a chip carrier substrate to alleviate chip and lead cracking, and a chip carrier formed thereby.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate. The substrate may in general include a rigid base having a conductive layer etched on one or both sides. Electrical connections are formed between the die and the conductive layer(s), and the conductive layer(s) provide an electric lead structure for integration of the die into an electronic system. Once electrical connections between the die and substrate are made, the assembly is then typically encased in a molding compound to provide a protective package.

In view of the small form factor requirements, as well as the fact that flash memory cards need to be removable and not permanently attached to a printed circuit board, such cards are often built of a land grid array (LGA) package. In an LGA package, the semiconductor die are electrically connected to exposed contact fingers formed on a lower surface of the package. External electrical connection with other electronic components on a host printed circuit board (PCB) is accomplished by bringing the contact fingers into pressure contact with complementary electrical pads on the PCB. LGA packages are ideal for flash memory cards in that they have a smaller profile and lower inductance than pin grid array (PGA) and ball grid array (BGA) packages.

Figure 1:
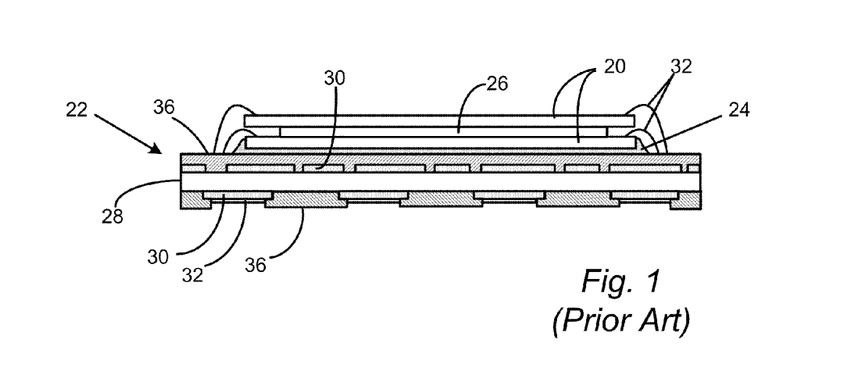
FIG. 1 is a cross sectional side view of a portion of a semiconductor package including semiconductor die mounted on a conventional substrate.

A cross-section of a conventional LGA package (without molding compound) is shown in FIG. 1. One or more die 20 are mounted on a substrate 22 via die attach 24. The die are shown separated by a dielectric spacer layer 26. In embodiments, the die 22 may be affixed to dielectric spacer layer 26 by an epoxy. Generally, the substrate 22 is formed of a rigid core 28, of for example polyimide laminate. Thin film copper layer(s) 30 may be formed on the core in a desired electrical lead pattern, including exposed surfaces for the contact fingers, using known photolithography and etching processes. The contact fingers 32 may be formed of a layer of gold deposited on the copper layer 30 to provide the electrical connection of the package to the host PCB. The substrate may be coated with a solder mask 36, leaving the contact fingers 32 exposed, to insulate and protect the electrical lead pattern formed on the substrate. The solder mask covers the surfaces of the substrate, leaving exposed those areas that are to be soldered. The die may be electrically connected to the substrate by wire bonds 34. Vias 42 (FIG. 2) are formed through the substrate to allow electrical connection of the die through the substrate to the contact fingers 32. Further examples of typical LGA packages are disclosed in U.S. Pat. Nos. 4,684,184, 5,199,889 and 5,232,372, which patents are incorporated by reference herein in their entirety.

Figure 2:
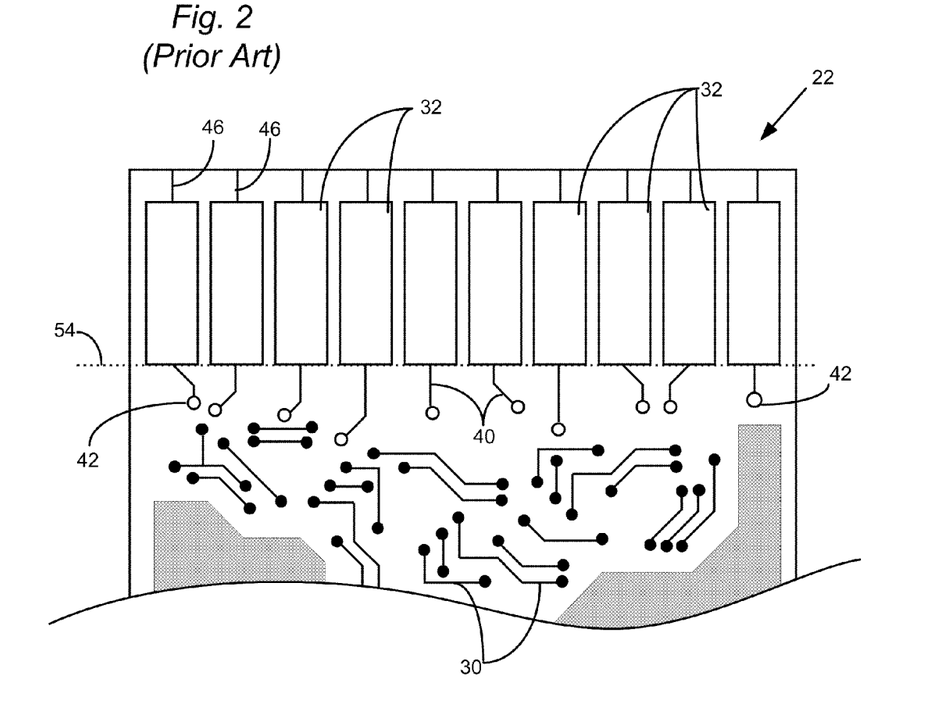
FIG. 2 is a bottom view of a conventional substrate including a plurality of contact fingers and other electrical contacts.

A bottom view of the substrate shown in prior art FIG. 1 is shown in prior art FIG. 2. As shown, the contact fingers 32 are generally rectangular with leads 40 extending from respective fingers to vias 42 or other electrical terminals. The contact fingers 32 also have plating traces 46 connecting each of the fingers 32 to a plating bar (not shown). The plating bar connects all of the contact fingers to the same electrical potential for plating during an electroplating process. In one such process, the substrate 22 is immersed in a plating bath including metal ions in an aqueous solution. A current is supplied to the plating bar, which current travels through the plating traces 46 to contact fingers 32. When the current is delivered, metal ions are attracted to the electrified and charged surfaces of the contact fingers. In this way, a layer of gold or other plating metal of a desired thickness may be deposited. After electroplating, the plating bar is removed leaving a portion of the plating traces 46 on the substrate 22.

After the die are mounted onto the substrate, the assembly is packaged within a molding compound to protect the assembly. During the molding process, the molding machine may output an injection force typically about 0.8 tons to drive the molding compound into the mold cavity. For die having a footprint of about 4.5 mm by 2.5 mm, this injection force may result in a pressure down on the die of about 1.2 $kgf/mm^2$.

A portion of the die 20 overlie an edge of the contact fingers. The edges of all contact fingers define a straight line 54 beneath the die, where the height of the substrate is greater (owing to the contact fingers) on one side of line 54 than on the other side. Upon exertion of the molding force, the difference in height along straight line 54 defined by the contact finger edges generates mechanical stress on the semiconductor die.

In the past, semiconductor die were better able to withstand the stress generated during the molding process in LGA packages. However, chip scale packages (CSP) and the constant drive toward smaller form factor packages require very thin die. It is presently known to employ wafer backgrind during the semiconductor fabrication process to thin die to a range of about 2 mils to 13 mils. At these thicknesses, the die are often not able to withstand the stresses generated during the molding process. Therefore, the die can crack, for example along the line 54.

Die cracking under the stress of the molding process will generally result in the package having to be discarded. Occurring at the end of the semiconductor fabrication and packaging process, this is an especially costly and burdensome problem.

In addition to die cracking, the leads 40 connect to the contact fingers 32 at right angles. The abrupt change in the conductance pattern at the junction where a lead 40 connects to a contact finger 32 generates mechanical stress at that junction.

Figure 3:
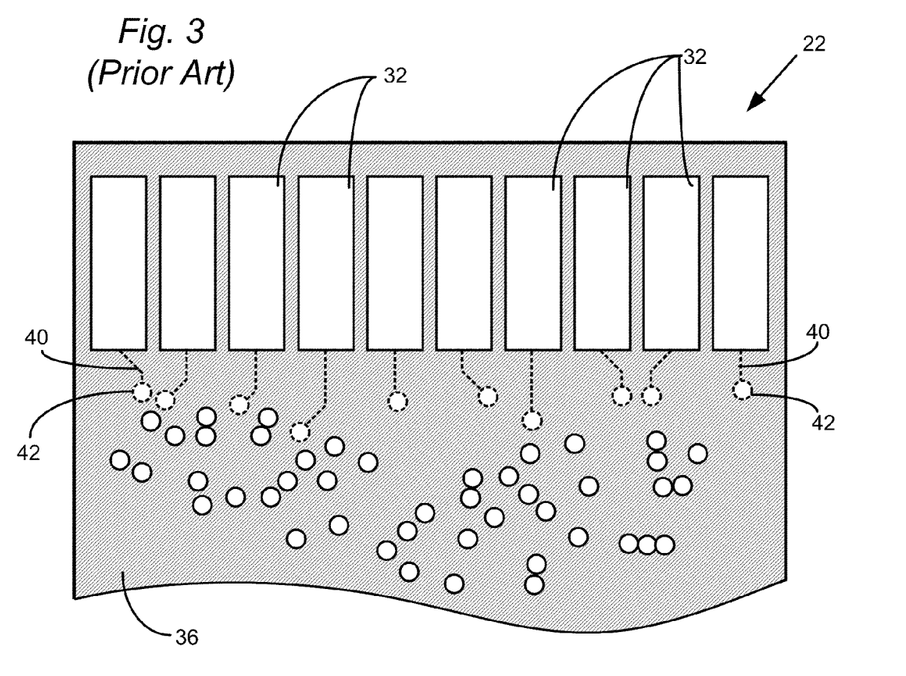
FIG. 3 is a bottom view of a conventional substrate shown in FIG. 2, including a layer of solder mask.

Moreover, as shown in prior art FIG. 3, the solder mask 36 is applied over the conductance pattern with openings for the contact fingers 32. The openings in the solder mask 36 at the contact fingers 32 begin at the junctions between the leads 40 (beneath the solder mask) and the contact fingers 32. Thus, the thickness of the substrate over the leads 40 (including the solder mask) is greater than the thickness of the substrate over the fingers 32 (not having the solder mask). This difference in thickness further generates mechanical stress at the junction between the leads 40 and the contact fingers 32.

Thus, mechanical stress is generated at the junction between the leads 40 and the contact fingers 32 both from the abrupt change in the patterns at the junction and the differences in substrate thicknesses at the junction. Over time, this mechanical stress can cause one or more of the leads 40 to break at or near the junction between the contact fingers and leads, resulting in package failure.

Separate and independent from the problem of die cracking and lead breaking, the portions of plating traces 46 remaining after the plating trace is severed from the contact fingers 32 tend to curl up over time. In particular, when a device formed from substrate 22 is used with a host device, the substrate contact fingers 32 are brought into pressure contact with pins on the host device. These host device pins often rub against the ends of plating traces 46. This contact may cause the ends of plating traces 46 to detach and curl up with repeated use of the flash memory device in a host device. While not a problem in and of itself, this curling of the plating traces 46 can cause one or more of the metal layers on the contact fingers 32 to delaminate from the substrate. This delamination of the contact finger layers may result in damage to the package and/or package failure.

SUMMARY OF THE INVENTION

One embodiment relates to a strengthened semiconductor die substrate and package. The semiconductor die package is formed of one or more semiconductor die mounted on a substrate, and a molding compound for encapsulating the one or more semiconductor die and substrate. The substrate includes contact fingers for electrical connection of the die package to external components. In embodiments of the present invention, the contact fingers may include nonlinear edges. Providing a nonlinear contour to the contact finger edges reduces the mechanical stress exerted on the semiconductor die which would otherwise occur with straight edges to the contact fingers. In embodiments, the edges of the contact fingers may have a rounded contour. In further embodiments, the edges of the contact fingers may have an irregular shaped contour.

In the embodiments, a taper may additionally be provided at the junction between the rounded edges and electrical leads connecting the contact fingers to vias. The taper reduces stress the junction of the rounded edge and electrical lead by distributing the forces at the junction over a larger area.

The edges of the contact fingers including the nonlinear contour may vary in alternative embodiments. Namely, a contact finger may have four edges: a first edge proximal to the near edge of the substrate, a second edge opposite the first edge, and third and fourth edges extending between and connecting the first and second edges. In embodiments, any one or more of the first, second, third and/or fourth edges of a contact finger may have a nonlinear contour.

Embodiments may additionally or alternatively include plating traces extending at an oblique angle from the top, corner or side of the contact fingers so as to terminate at an edge of the substrate at a location between adjacent contact fingers. In this position, at least the ends of the plating traces at the edge of the substrate are covered beneath a lid in which the finished semiconductor package is encased. By providing the plating traces angled off to the side of the contact fingers with ends beneath the lid, contact between the pins on a host device and the ends of the plating traces is avoided when the finished semiconductor device is used with the host device. Thus, the plating traces do not detach from the substrate and the contact fingers remain solidly laminated on the substrate.

DETAILED DESCRIPTION

Embodiments will now be described with reference to FIGS. 4 through 21, which relate to a strengthened semiconductor package. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 4:
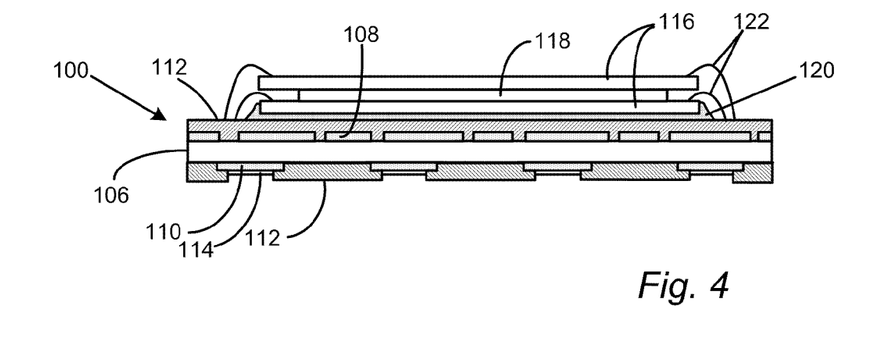
FIG. 4 is a cross sectional side view of a portion of a semiconductor package, including semiconductor die mounted on a substrate according to embodiments of the present invention.
Figure 5:
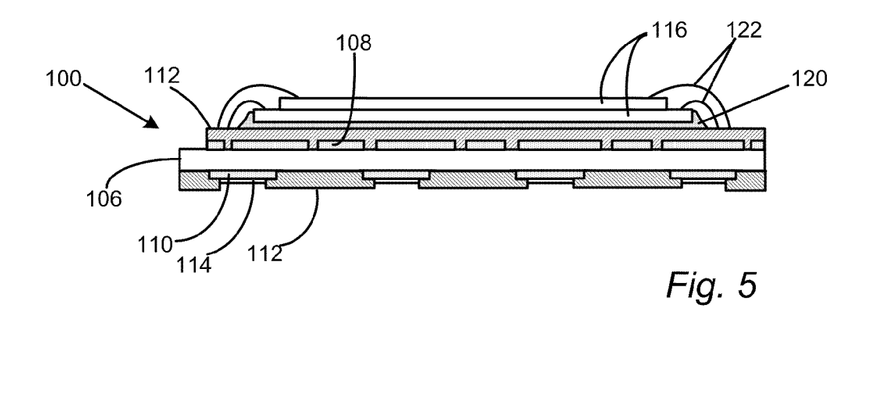
FIG. 5 is a cross sectional side view of a portion of a semiconductor package, including an alternative configuration of semiconductor die on a substrate according to embodiments of the present invention.
Figure 6:
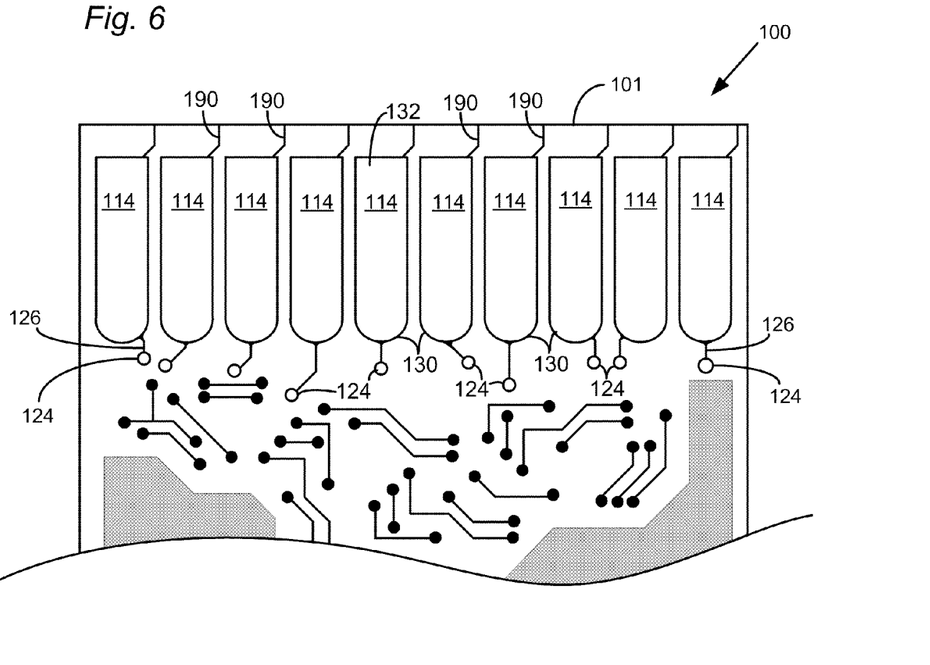
FIG. 6 is a bottom view of a substrate according to embodiments of the present invention, including contact fingers with rounded edges.
Figure 7:
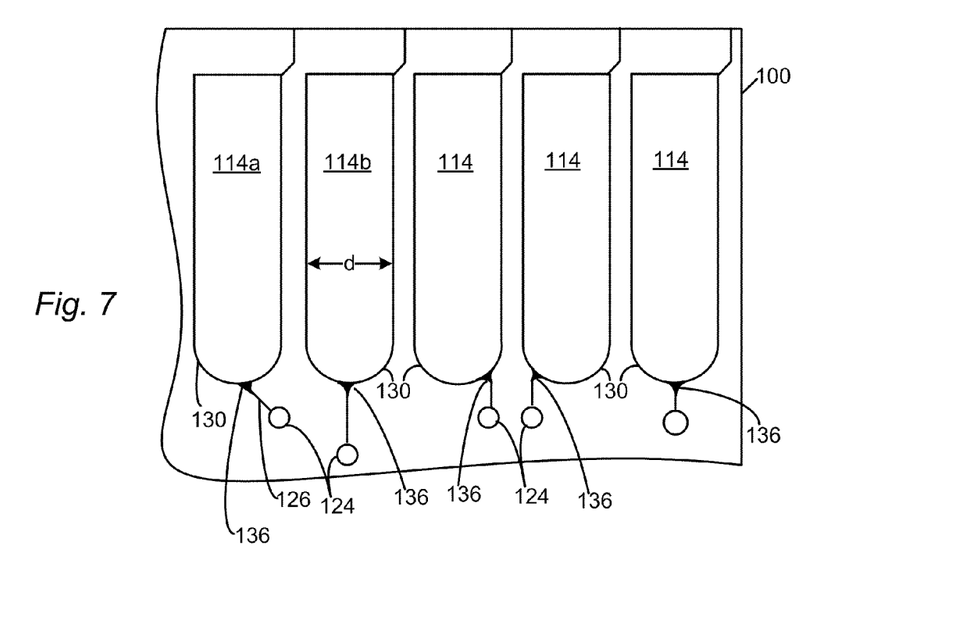
FIG. 7 is an enlarged partial view of the substrate shown in FIG. 6.

FIGS. 4 and 5 are cross-sectional side views of a substrate 100 having alternative configurations of stacked semiconductor die 116. Although not clearly seen in the cross-sectional view of FIGS. 4 and 5, substrate 100 differs from prior art substrates such as that shown in FIG. 1 at least in that substrate 100 includes contact fingers with rounded or otherwise nonlinear edges as explained hereinafter. FIG. 6 and the enlarged view of FIG. 7 are partial bottom views of a portion of the substrate 100 shown in FIGS. 4 and/or 5 and having an edge 101.

Substrate 100 may be a variety of different chip carrier mediums, including a PCB, a leadframe or a tape automated bonded (TAB) tape. Where substrate 100 is PCB, the substrate may be formed of a core 106, having a top conductive layer 108 formed on a top surface of the core 106, and a bottom conductive layer 110 formed on the bottom surface of the core. The core 106 may be formed of various dielectric materials such as for example, polyimide laminates, epoxy resins including FR4 and FR5, bismaleimide triazine (BT), and the like. Although not critical to the present invention, core 106 may have a thickness of between 40 microns (μm) to 200 μm, although the thickness of the core may vary outside of that range in alternative embodiments. The core 106 may be ceramic or organic in alternative embodiments.

The conductive layers 108 and 110 may be formed of copper or copper alloys, plated copper or plated copper alloys, Alloy 42 (42Fe/58Ni), copper plated steel, or other metals and materials known for use on substrates. The layers 108 and 110 may have a thickness of about 10 μm to 24 μm, although the thickness of the layers 108 and 110 may vary outside of that range in alternative embodiments.

The layer 108 and/or layer 110 may be etched with a conductance pattern for communicating signals between one or more semiconductor die and an external device. One process for forming the conductance pattern on the substrate 100 is explained with reference to the flowchart of FIG. 8. The surfaces of conductive layers 108 and 110 are cleaned in step 250. A photoresist film is then applied over the surfaces of layers 108 and 110 in step 252. A pattern mask containing the outline of the electrical conductance pattern may then be placed over the photoresist film in step 254. The photoresist film is exposed (step 256) and developed (step 258) to remove the photoresist from areas on the conductive layers that are to be etched. The exposed areas are next etched away using an etchant such as ferric chloride in step 260 to define the conductance patterns on the core. Next, the photoresist is removed in step 262. Other known methods for forming the conductance pattern on substrate 100 are contemplated.

Figure 8:
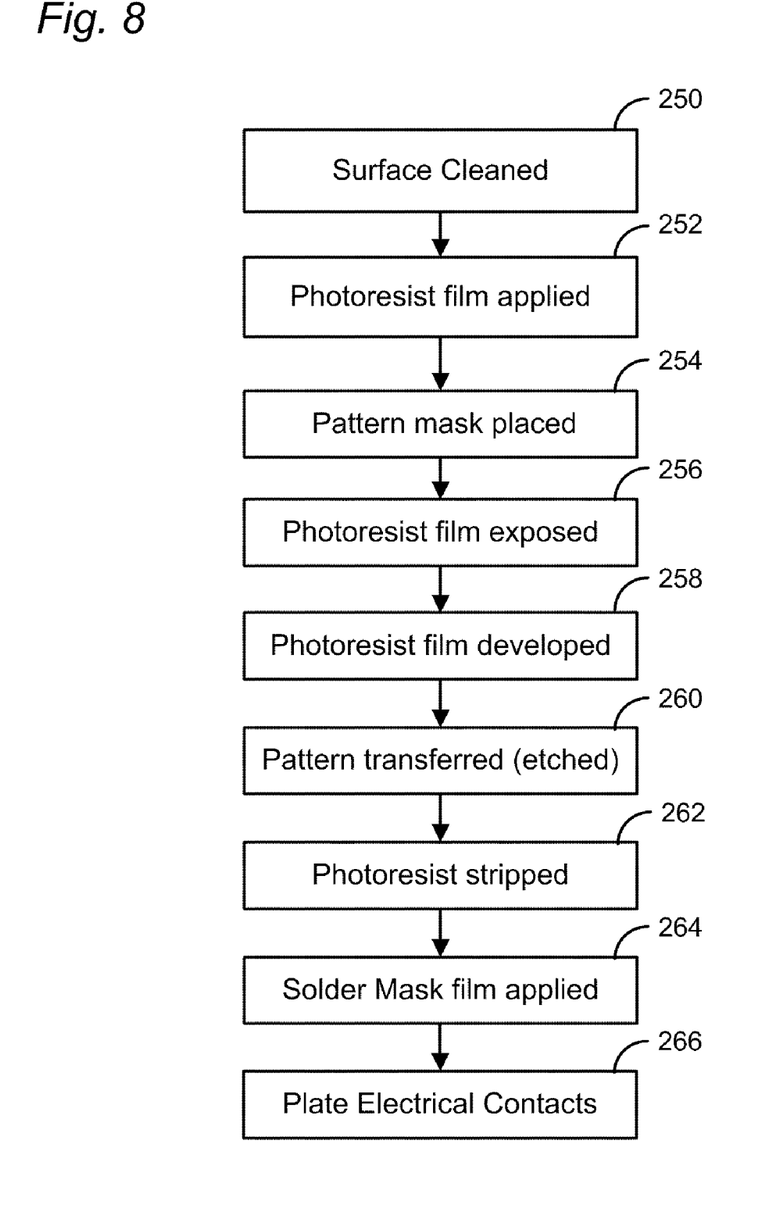
FIG. 8 is a flowchart of a process for forming substrates according to embodiments of the present invention.

Once patterned, the top and bottom conductive layers 108, 110 may be laminated with a solder mask 112 in a step 264. In embodiments where substrate 100 is used for example as an LGA package, one or more gold layers may be formed on portions of the bottom conductive layer 110 in step 266 to define contact fingers 114 as is known in the art for communication with external devices. The one or more gold layers may be applied in a known electroplating process. It is understood that the present invention may be used with other types of semiconductor packages, including for example BGA packages.

FIG. 4 further shows two stacked semiconductor die 116 mounted on the substrate 100. The die 116 are shown separated by a silicon spacer 118 as is known in the art. FIG. 5 illustrates a portion of an alternative semiconductor package including a pair of semiconductor die 116 mounted directly adjacent to each other. The top semiconductor die 116 is smaller than the bottom semiconductor die 116 in the embodiment of FIG. 5. Thus, electrical leads may be connected to the bottom semiconductor die at the edges of the bottom semiconductor die extending beyond the edges of the top semiconductor die. Embodiments of the invention may alternatively include a single die, and embodiments of the invention may alternatively include between 3 and 8 or more die stacked in an SiP, MCM or other type of arrangement. The one or more die may have thicknesses ranging between 2 mils to 20 mils, but the one or more die may be thinner than 2 mils and thicker than 20 mils in alternative embodiments. While not critical to the present invention, the one or more die 116 may be a flash memory chip (NOR/NAND), SRAM or DDT, and/or a controller chip such as an ASIC. Other silicon chips are contemplated.

The one or more die 116 may be mounted on the top surface of the substrate 100 using a known adhesive or eutectic die bond process, with a known die attach compound 120. Such die attach compounds are manufactured for example by Semiconductor Packaging Materials, Inc. of Armonk, N.Y. The one or more die 116 in FIGS. 4 and 5 may be electrically connected to conductive layers 108, 110 of the substrate 100 by wire bonds 122 using a known wire bond process.

FIG. 6 shows a bottom view of the positions of contact fingers 114 formed on the bottom surface of the substrate 100. The contact fingers 114 are provided to establish an electrical connection in a known manner with contact pins of a host PCB (not shown), or other electronic component, when the contact fingers 114 are brought into pressure contact against the contact pins (or other connectors) of the host PCB. While ten contact fingers 114 are shown, it is understood that there may be more or less than ten contact fingers in alternative configurations of the chip carrier substrate 100. In an embodiment, there may be eight contact fingers. The contact fingers 114 are shown connected to vias 124 by leads 126 defined in the conductance pattern in layer 110. Vias 124 are provided to communicate electrical signals between the top and bottom conductance patterns on layers 108 and 110.

Referring to the bottom view of FIG. 6 and the enlarged view of FIG. 7, in embodiments of the present invention, contact fingers 114 may include rounded edges 130 at an end of contact fingers 114 adjacent to electrical leads 126. As explained hereinafter, an opposite end 132 of contact fingers 114 may additionally include rounded edges. The rounded edges 130 may be defined in the pattern mask and formed integrally with contact fingers 114 during the photolithography process as described above for forming the conductance pattern(s) on the substrate 100. In the embodiments, the radius of curvature of rounded edges 130 may be one half the diameter, d, of contact fingers 114 so as to form half circles at the end of the contact fingers. However, as will be explained hereinafter, the radius of curvature of rounded edges 130 may vary in alternative embodiments of the present invention.

As explained in the background of the invention, conventional contact fingers define a straight edged stepped surface beneath the semiconductor die. A downward force on the die lying atop such a straight edged stepped surface generates much larger mechanical stress in the die than would the same downward force on the die lying atop curved edges. Rounded or nonlinear shaped edges provide support in two dimensions in the plane of the die, where a straight edge does not. Providing a rounded shape to the contact finger edges 130 removes the straight edge otherwise defined by the collective ends of conventional contact fingers. Thus, the rounded edges 130 in embodiments of the present invention reduce the mechanical stress exerted on the semiconductor die 116.

Referring to FIG. 7, embodiments of the present invention may include a taper 136 at the junction between the electrical leads 126 and the rounded edges 130 of each of the contact fingers 114. As described in the Background of the Invention section, the abrupt change where an electrical lead connects to a contact finger often generates large mechanical stress at that junction. Taper 136 serves to alleviate the mechanical stress at the junction by distributing the forces at the junction over a larger area.

Tapers 136 are defined in the conductance pattern during the photolithography process. The amount of metal left on the substrate to define each of the tapers 136 may vary in alternative embodiments. For example, tapers 136 may begin with a width equal to electrical lead 126 and widen out to a width between two and twenty times greater than the width of electrical lead 126, and more particularly between two and ten times greater than the width of the electrical lead, at the junction where the tapers 136 connect with rounded edges 130. The width of a taper 136 at the junction where the taper connects with a rounded edge may be less than twice the width of the electrical lead 126 and more than twenty times the width of the electrical lead 126 in alternative embodiments.

The tapers 136 may be generally triangular in shape, and may have straight, concave or convex sides extending from electrical leads 126 to the junction with rounded edges 130. As seen in FIGS. 6 and 7, tapers 136 may be formed around the radius of rounded edge 130 at any location, depending on where an electrical lead 126 joins to the rounded edge 130. Moreover, the shape of tapers 136 may vary depending on the angle between electrical lead 126 and rounded edge 130. For example, FIG. 7 shows contact fingers 114a and 114b, which are examples of contact fingers 114. Electrical lead 126 meets contact finger 114a at an oblique angle, where electrical lead 126 meets contact finger 114b at a substantially right angle. The shape of the tapers 136 may thus be different at contact finger 114a than 114b.

While all junctions between electrical leads 126 and contact fingers 114 may include a taper 136, taper 136 may be omitted from some or all of the junctions between leads 126 and contact fingers 114 in the embodiments of the present invention. Moreover, in embodiments, the shape, width and/or length of tapers 136 may be different for each contact finger 114, or different for each of two or more subsets of contact fingers 114.

Figure 9:
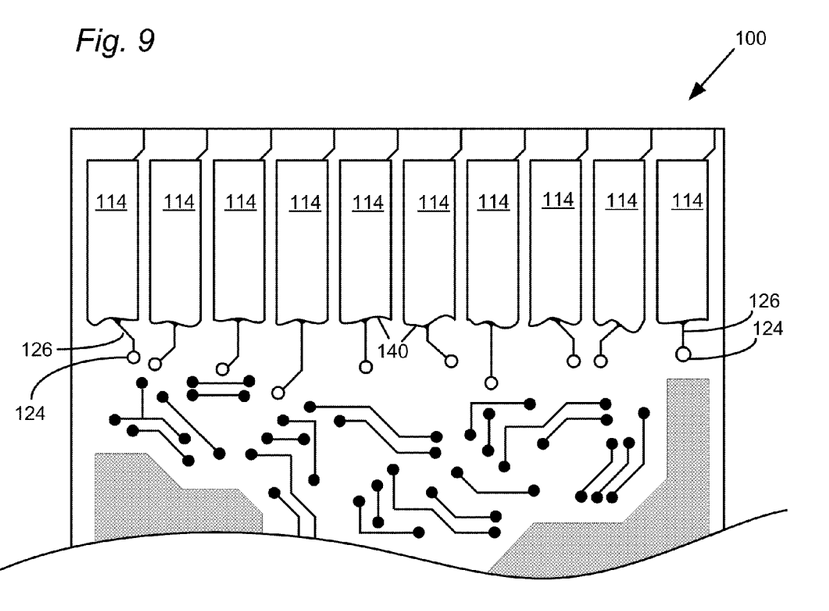
FIG. 9 is a bottom view of a substrate, including contact fingers according to an alternative embodiment of the present invention.
Figure 10:
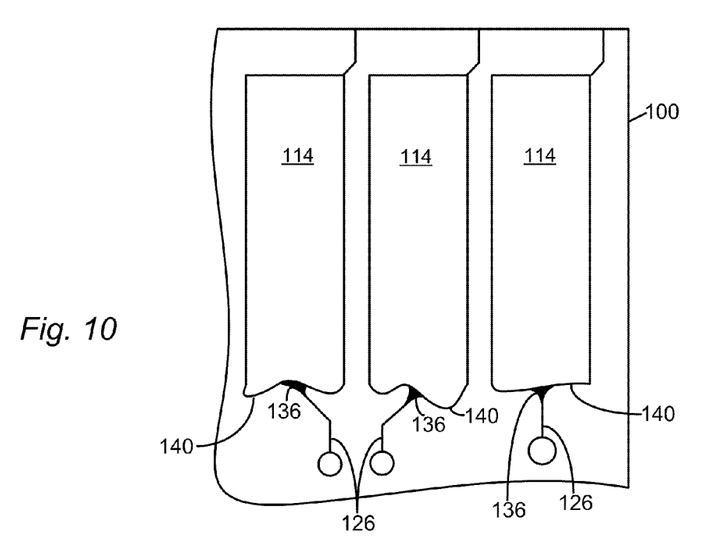
FIG. 10 is an enlarged view of a portion of the substrate shown in FIG. 9.

Referring now to FIGS. 9 and 10, as opposed to a rounded edge 130, other nonlinear configurations may be provided to the edge of the contact fingers 114 to prevent a straight line being defined by the edges of the contact fingers 114. For example, in FIGS. 9 and 10, contact fingers 114 include irregular shaped edges 140. Each of the edges 140 may include the same irregular shape, or the irregular shape of each of the edges 140 may vary relative to each other. The irregular shape of edge 140 may be defined in the pattern mask during the photolithography process. In the embodiments, a taper 136 as described above may be provided at each connection point between electrical lead 126 and irregular shaped edge 140. Taper 136 may be omitted at the connection point between the electrical leads and some or all of the contact finger edges 140 in the embodiments of the present invention.

In the embodiments described above, each contact finger 114 has a nonlinear lower edge (i.e., an edge of fingers 114 distal from edge 101 of substrate 100). In alternative embodiments, it is understood that one or more of the contact fingers 114 may have a linear lower edge, but the lower edges of all of the contact fingers taken together define a nonlinear contour across the substrate. As used herein, "nonlinear" refers to a line, profile or contour that is not straight.

Figure 11:
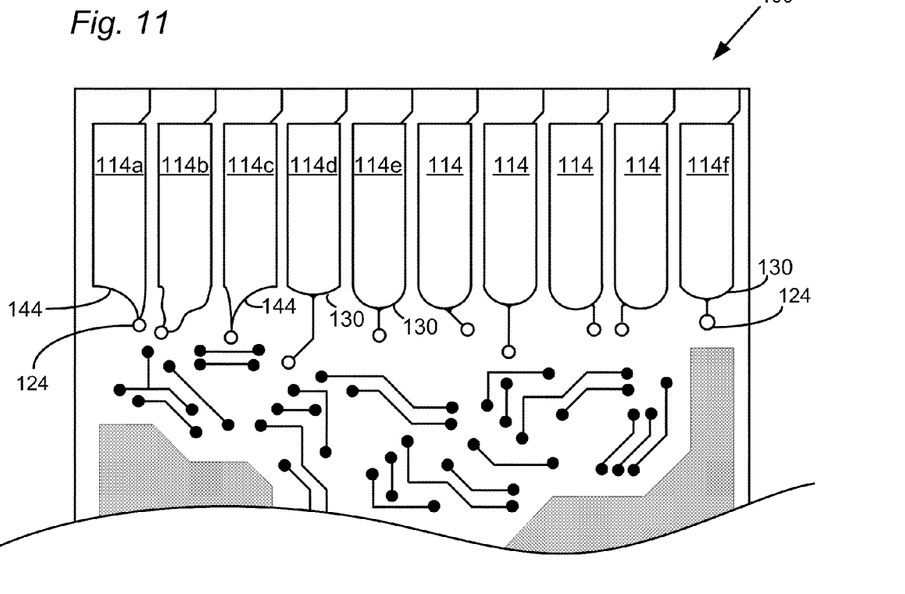
FIG. 11 is a bottom view of a substrate, including contact fingers according to a further alternative embodiment of the present invention.
Figure 12:
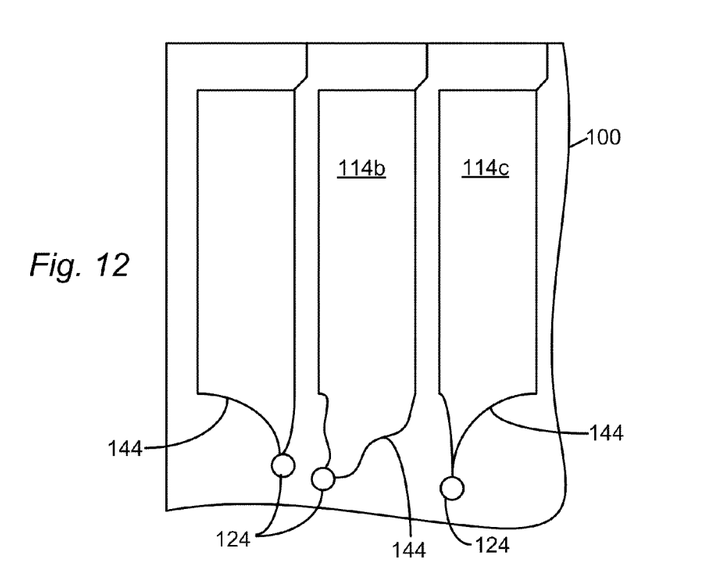
FIG. 12 is an enlarged view of a portion of the substrate shown in FIG. 11.
Figure 13:
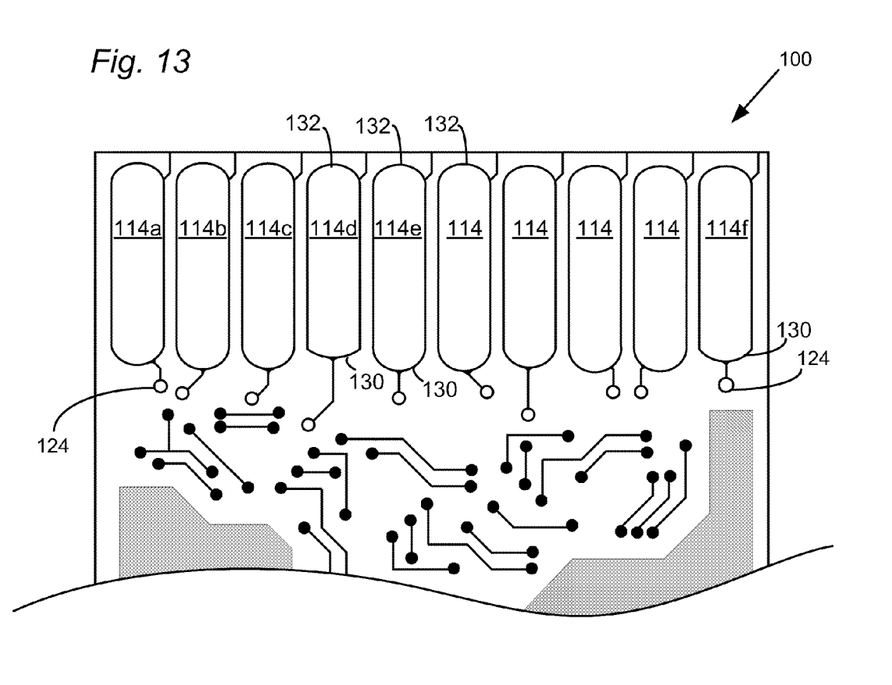
FIG. 13 is a bottom view of a substrate, including contact fingers according to a further alternative embodiment of the present invention.

In FIGS. 6, 7, 9 and 10, a taper 136 may be provided to reduce the mechanical stress at the connection point of the electrical lead to the contact finger 114. In a further embodiment of the present invention, the electrical lead 126 may be omitted altogether, and the contact finger 114 itself may extend into direct electrical contact with the via 124. For example, as shown in FIGS. 11 and 12, contact fingers 114a, 114b, and 114c have edges 144 which extend in direct electrical contact with vias 124. In FIGS. 11 through 13, contact fingers 114a, 114b, 114c, 114d, 114e and 114f are examples of contact fingers 114. Edges 144 of contact fingers 114a, 114b and 114c may taper smoothly to vias 124, as in fingers 114a and 114c. Alternatively, edge 144 may have an irregular taper to via 124, as shown in finger 114b. The shape of edge 144 may be defined in the photo mask during the photolithography process. While only three fingers 114a, 114b, and 114c are shown with a lower edge extending directly to vias 124, it is understood that all of the fingers may have lower edges 144 extending to their associated vias.

As described above, where a contact finger 114 has a rounded lower edge, the radius of curvature of that lower edge may vary with respect to the rounded edges of other contact fingers 114 in alternative embodiments. FIG. 11 shows a finger 114e having a radius of curvature of its lower edge 130 which may be for example a half circle as described above. However, fingers 114d and 114f have lower edges 130 with larger radii of curvature, therefore extending downward a shorter distance than rounded edge 130 on contact finger 114e. Different contact fingers 114 may have different radii of curvature. One reason for having a larger radius of curvature is because a via 124 is located close to the bottom edge of contact finger 114 and a smaller radius of curvature is not practical.

As indicated above, a second edge 132 of contact fingers 114 may also have a rounded edge. Such embodiment is shown in FIG. 13. Edges 132 may have differing radii of curvature as described above. Moreover, instead of it being rounded, edges 132 may have an irregular shape as described above with respect to FIGS. 7 and 8. Less than all of the contact fingers 114 may include an upper rounded edge 132 in alternative embodiments of the present invention. While lower rounded edges 130 and upper rounded edges 132 are shown as being concave, it is understood that edges 130 and/or 132 may be convex in alternative embodiments of the present invention. In a further embodiment of the present invention, it is understood that the one or both of the two sides of contact fingers 114 extending between and connecting edges 130 and 132 may have nonlinear edges in accordance with any of the embodiments of edges 130 and 132 described herein.

Figure 14:
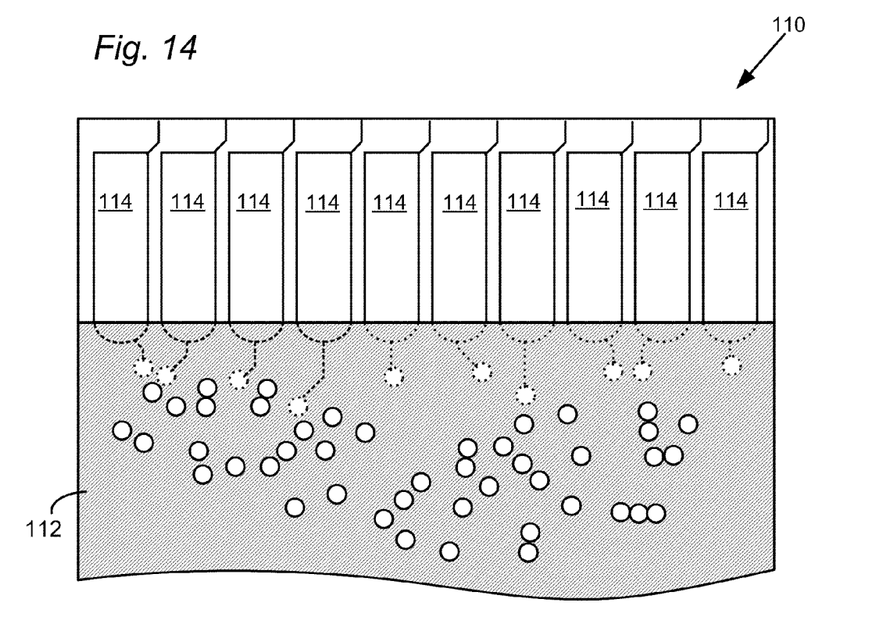
FIG. 14 is a bottom view of a substrate according to embodiments of the present invention, including a layer of solder mask.
Figure 15:
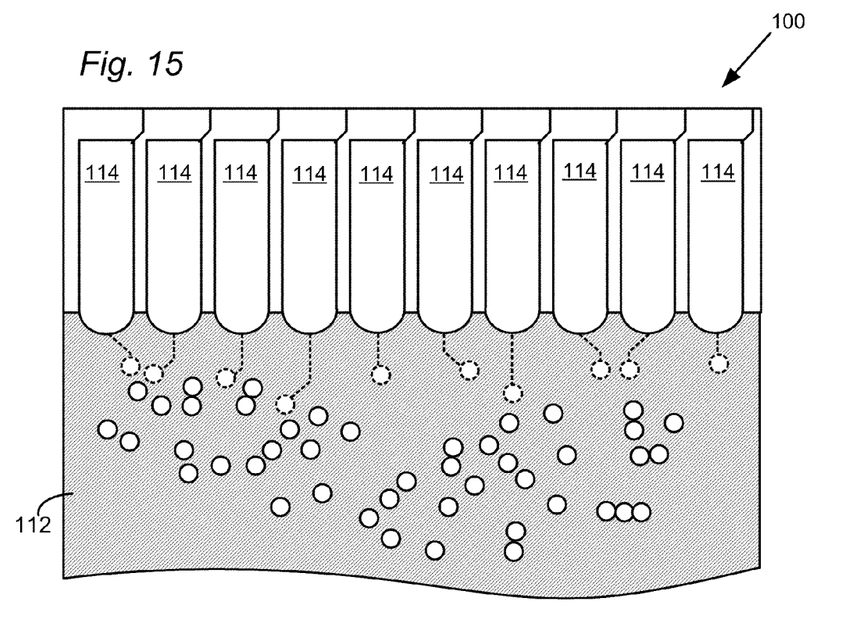
FIG. 15 is a bottom view of a substrate according to embodiments of the present invention, including an alternative application of solder mask.

Referring now to FIG. 14, after formation of the conductance pattern of substrate 100 and plating of fingers 114 and other electrical leads, the solder mask 112 may be applied to the substrate. As shown in FIG. 12, solder mask 112 may cover the lower rounded edges and (if present), the upper rounded edges of contact fingers 114. Alternatively, the solder mask 112 may be applied so as not to cover the lower rounded edge and/or the upper rounded edge in alternative embodiments of the present invention, such as shown in FIG. 15. While rounded edges are shown in FIGS. 14 and 15, it is understood that solder mask 112 may be applied so as to cover or not cover any configuration of the nonlinear edges of contact fingers 114 described above.

Figure 16:
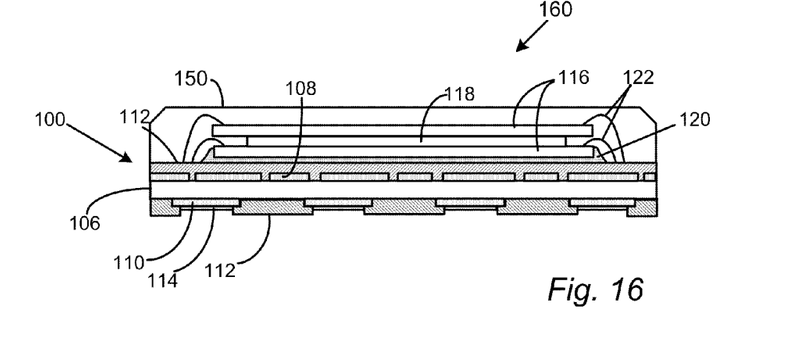
FIG. 16 is a cross sectional side view of a semiconductor package according to embodiments of the present invention.

FIG. 16 is a cross-sectional side view of a finished semiconductor die package 160 having substrate 100 and die 116 encased within molding compound 150. After the solder mask 112 is applied, and the wire bond connections are made, the substrate 100 and die 116 may be encased within the molding compound 150 in a known encapsulation process to form a finished semiconductor die package 160. Molding compound 150 may be an epoxy such as for example available from Sumitomo Corp. and Nitto Denko Corp., both having headquarters in Japan. Other molding compounds from other manufacturers are contemplated. The molding compound may be applied according to various processes, including by transfer molding or injection molding techniques, to encapsulate the substrate 100 and semiconductor die 116.

Figure 17:
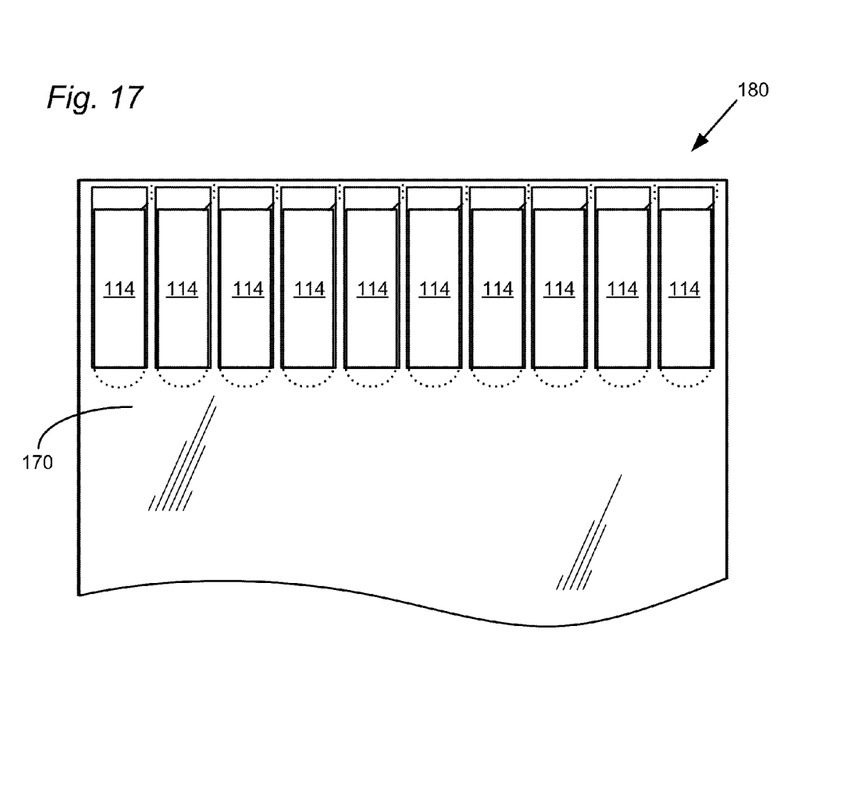
FIG. 17 is a bottom view of a flash memory device including a semiconductor package according to the embodiments of the present invention encased within a lid.

FIG. 17 illustrates package 160 enclosed within a lid 170 to define a flash memory device 180. The lid 170 shown in FIG. 17 covers the nonlinear edges of contact fingers 114. Such a lid may be used in an embodiment where the solder mask also covers the nonlinear edges (FIG. 14) or the solder mask does not cover the nonlinear edges (FIG. 15). In a further embodiment, the lid may have curved or other non-linear edges so as to expose the non-linear edges of the contact fingers. It is understood that flash memory device 180 may be any of various devices including contact fingers 114 for mating with contact pins on a host device. It is further understood that package 160 may be used as a flash memory device 180 without being encased within a lid 170 in embodiments.

Figure 18:
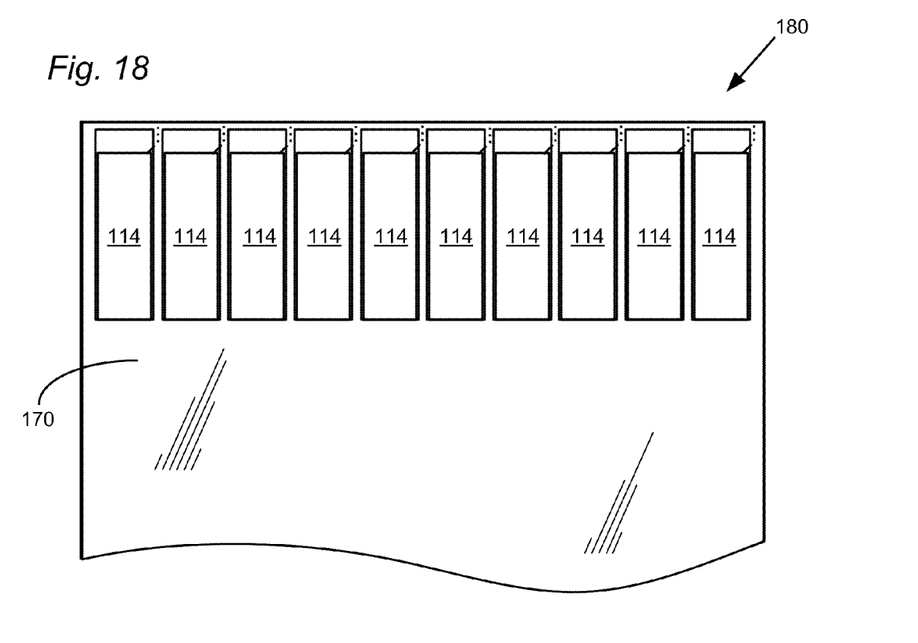
FIG. 18 is a bottom view of a flash memory device including plating traces angled off to the side according to embodiments of the present invention.
Figure 19:
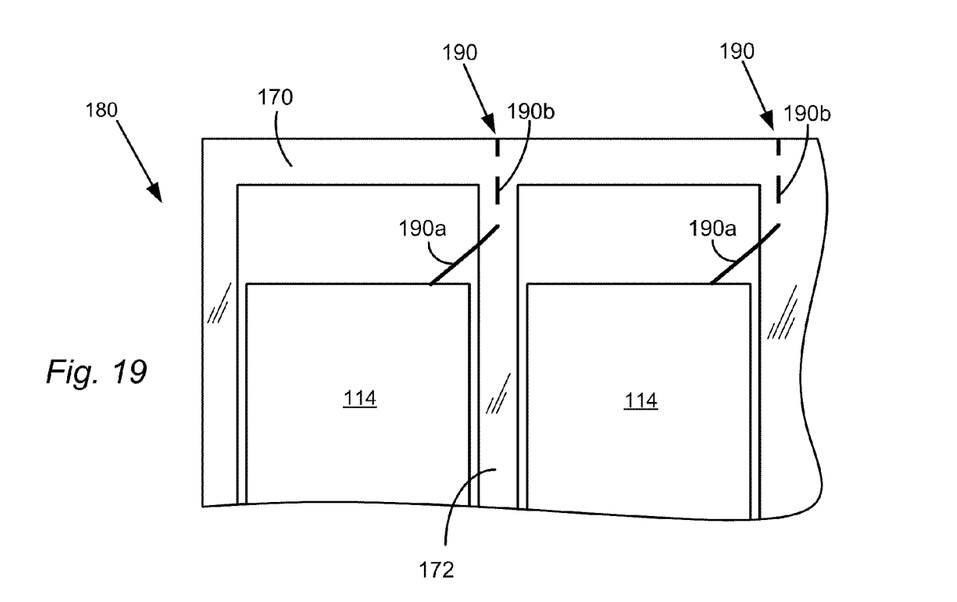
FIG. 19 is an enlarged view of a portion of the flash memory device of FIG. 18 showing the angled plating traces having portions covered by a lid.
Figure 20:
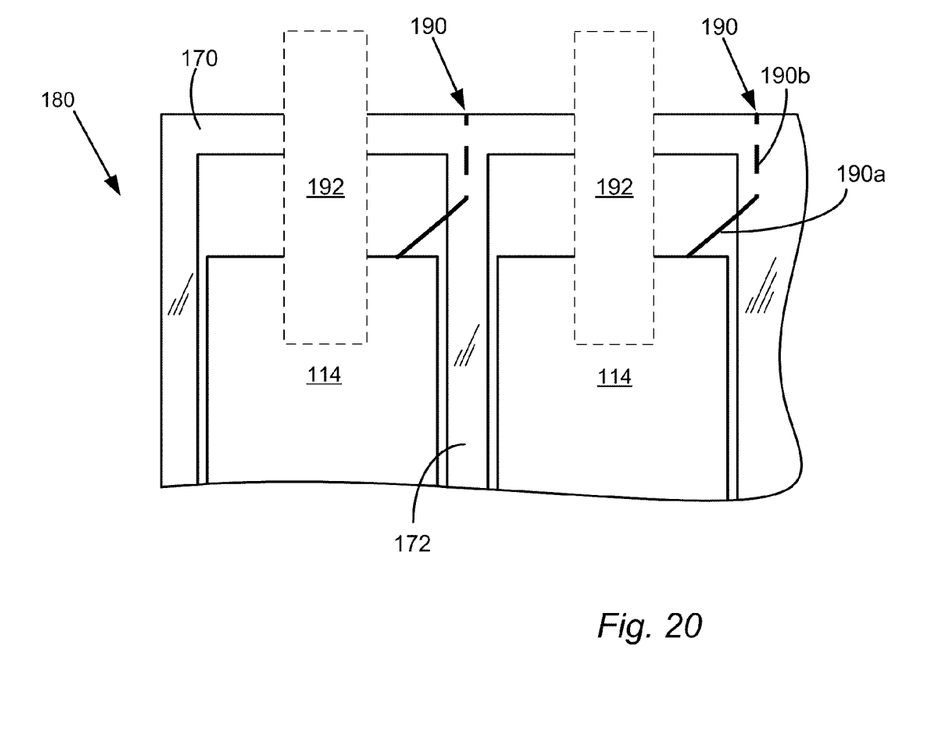
FIG. 20 is an enlarged view of a portion of the flash memory device of FIG. 18 showing the angled plating traces and contact pins of a host electronic device.

Referring to FIGS. 18 through 20, embodiments of the present invention may include plating traces 190 used during the electroplating process of contact fingers 114. Plating traces 190 may extend at an oblique angle from the top, corner or side of the contact fingers so as to terminate at an edge of the substrate at a location between adjacent contact fingers 114. As explained in the Background of the Invention section, conventional plating traces extended straight up from the contact pins. Thus, when the contact fingers were brought into pressure contact with the host device, pins on the host device often rubbed against the plating traces. This frictional contact may cause the plating traces to detach from the substrate, which could result in delamination of the contact finger from the substrate.

As best seen in FIG. 18, each plating trace may include a first section 190a extending at a 45° angle from the top or corner of a contact finger 114, and a second section 190b extending upward from the first section 190a. It is understood that the first section may extend at angles greater than or less than 45° in alternative embodiments. The second section 190b lies between adjacent contact fingers 114, and may connect to a plating bar (not shown) during the fabrication process. The connection is severed and the plating bar is removed after the plating process is complete.

By providing plating traces 190 angled off to the side of the contact fingers 114, the sections 190b and a portion of sections 190a lie beneath ribs 172 of lid 170. Thus, when flash memory device 180 is brought into contact with a host device having pins 192 (shown in phantom in FIG. 20), the pins 192 engage contact fingers 114 without touching the portions of the plating traces beneath the ribs 172. Thus, the plating traces do not detach from the substrate 100 and the contact fingers 114 remain solidly laminated on the substrate. Angled plating traces 190 may be defined in the photo mask during the photolithography process and plated during the electroplating process of contact fingers 114. Angled plating traces 190 may be used in the embodiments of a flash memory device including lids 170, or where package 160 operates without a lid 170.

Figure 21:
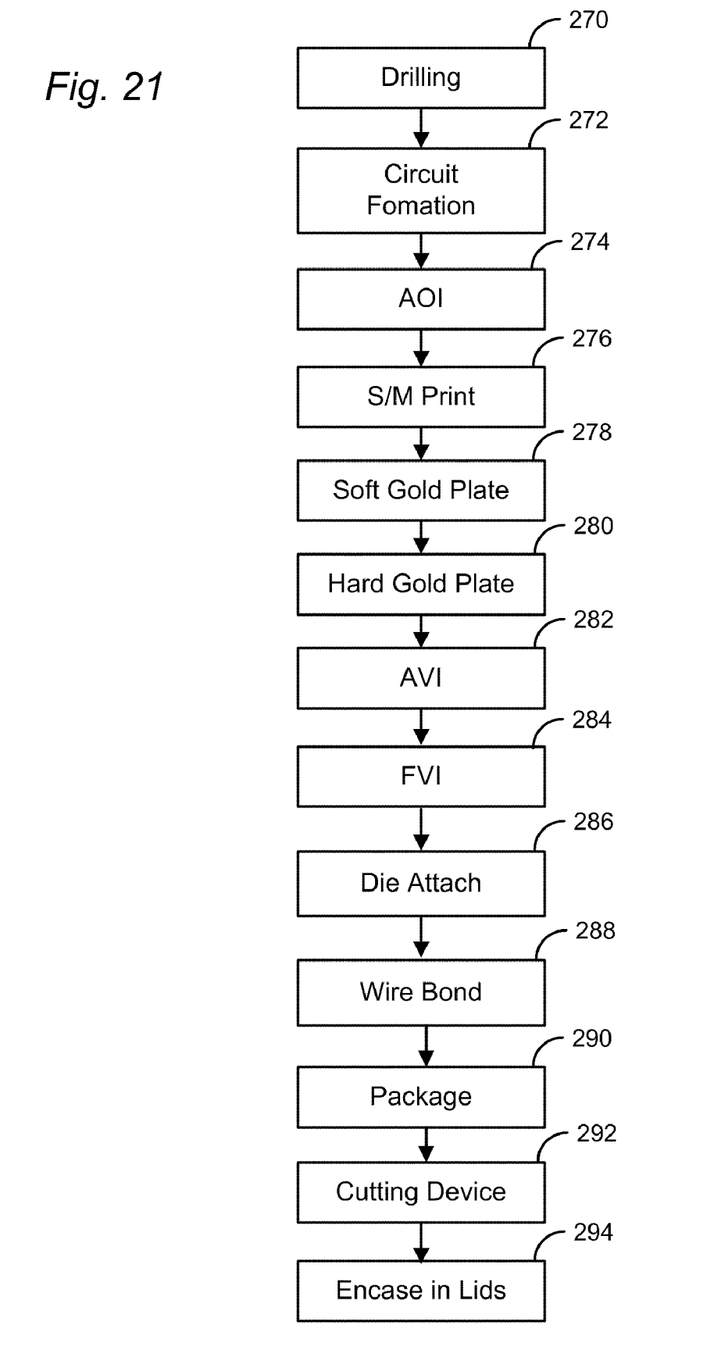
FIG. 21 is a flowchart of a process for forming a semiconductor package according to embodiments of the present invention.

The flowchart of FIG. 21 sets forth an overall process for forming a finished die package from a starting point of a large substrate panel. As explained hereinafter, the substrate panel is separated into individual substrates after fabrication. In a step 270, the panel is drilled to provide reference holes off of which the position of the respective substrates is defined. The conductance pattern is then formed on the respective surfaces of the panel in step 272 as explained above. The patterned panel is then inspected in an automatic optical inspection (AOI) in step 274. Once inspected, the solder mask is applied to the panel in step 276.

After the solder mask is applied, the contact fingers may be plated. A soft gold layer is applied over certain exposed surfaces of the conductive layer on the bottom surface of the substrate, as for example by thin film deposition, in step 278. As the contact fingers are subject to wear by contact with external electrical connections, a hard layer of gold may be applied, as for example by electroplating, in step 280. It is understood that a single layer of gold may be applied in alternative embodiments.

The individual substrates are then inspected and tested in an automated step (step 282) and in a final visual inspection (step 284) to check electrical operation, and for contamination, scratches and discoloration. The substrates that pass inspection are then sent through the die attach process in step 286. The wire bonds and other electrical connections are then made on the substrate in a step 288, and the substrate and die are then packaged in step 290 in a known injection mold process to form a JEDEC standard (or other) package as described above.

A cutting device then separates the panel into individual packages 160 in step 292. Where the packages 160 form a flash memory within lids 170, the packages may be enclosed within lids 170 in a step 294. It is understood that a die package 160 including nonlinear edged contact fingers may be formed by other processes in alternative embodiments.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of preventing contact of a pin on a host device with a plating trace attached to a contact finger of a semiconductor package when the package is used with the host device, the method comprising the steps of:
   (a) defining a shape and location of the plating trace on a substrate of the semiconductor package with a first end connected to the contact finger, and a second end terminating at an edge of the substrate, the location of the second end being at a position beneath a lid for the semiconductor package;

(b) forming the plating trace on the substrate; and (c) plating the contact finger via the plating trace.

2. A method as recited in claim 1, said step (a) of defining a shape and location of the plating trace comprising the step of defining a shape and location of the plating trace in a mask pattern for a photolithography process.

3. A method as recited in claim 1, said step (b) of forming the plating trace on the substrate comprising the steps of:

forming the plating trace to establish electrical communication between the contact finger and a plating bar; and removing the plating bar after the plating process of the contact finger is completed in said step (c).

4. A method as recited in claim 1, further comprising the step of covering the semiconductor package with a lid, the second portion of the plating trace being beneath the lid.

5. A method as recited in claim 4, further comprising the step of covering at least a portion of the first plating trace with the lid.

6. A method as recited in claim 1, said step (a) of defining a shape and location of the plating trace comprising the step of forming the first portion of the plating trace at an oblique angle to the contact finger.

7. A method as recited in claim 1, said step (a) of defining a shape and location of the plating trace comprising the step of forming the first portion of the plating trace at an approximately 45° angle to the contact finger.

8. A method as recited in claim 7, said step (a) of defining a shape and location of the plating trace comprising the step of forming the second portion of the plating trace at an approximately 45° angle to the first portion of the plating trace.

9. A method of preventing contact of a pin on a host device with a plating trace attached to a contact finger of a substrate of a semiconductor package when the package is used with the host device, a width dimension being defined on the substrate overlapping and corresponding to a width of the contact finger, the method comprising the steps of:

(a) defining a shape and location of the plating trace on a substrate of the semiconductor package with a first end connected to the contact finger, and a second end terminating at a position on the substrate outside of the width dimension;

(b) forming the plating trace on the substrate; and (c) plating the contact finger via the plating trace.

10. A method as recited in claim 9, said step (a) of defining a shape and location of the plating trace comprising the step of defining a shape and location of the plating trace in a mask pattern for a photolithography process.

11. A method as recited in claim 9, said step (b) of forming the plating trace on the substrate comprising the steps of:

forming the plating trace to establish electrical communication between the contact finger and a plating bar; and removing the plating bar after the plating process of the contact finger is completed in said step (c).

12. A method as recited in claim 9, further comprising the step of covering the semiconductor package with a lid, the second portion of the plating trace being beneath the lid.

13. A method as recited in claim 12, further comprising the step of covering at least a portion of the first plating trace with the lid.

14. A method as recited in claim 9, said step (a) of defining a shape and location of the plating trace comprising the step of forming the first portion of the plating trace at an oblique angle to the contact finger.

15. A method as recited in claim 9, said step (a) of defining a shape and location of the plating trace comprising the step of forming the first portion of the plating trace at an approximately 45° angle to the contact finger.

16. A method as recited in claim 15, said step (a) of defining a shape and location of the plating trace comprising the step of forming the second portion of the plating trace at an approximately 45° angle to the first portion of the plating trace.

\* \* \* \* \*